United States Patent [19]
Walker et al.

[11] Patent Number: 4,811,285
[45] Date of Patent: Mar. 7, 1989

[54] ANALOG STORAGE INTEGRATED CIRCUIT

[75] Inventors: J. T. Walker, Palo Alto; R. S. Larsen, Menlo Park; S. L. Shapiro, Palo Alto, all of Calif.

[73] Assignee: The Board of Trustees of the Leland Stanford Junior University, Stanford, Calif.

[21] Appl. No.: 144,611

[22] Filed: Jan. 11, 1988

Related U.S. Application Data

[63] Continuation of Ser. No. 595,790, Apr. 2, 1984, abandoned.

[51] Int. Cl.$^4$ ............................................. G11C 27/00
[52] U.S. Cl. ...................................... 365/45; 365/149; 365/210; 365/240
[58] Field of Search ................. 365/45, 189, 210, 230, 365/240, 149

[56] References Cited

U.S. PATENT DOCUMENTS

| | | | |
|---|---|---|---|
| 3,898,656 | 8/1975 | Jensen | 342/106 |
| 4,271,488 | 6/1981 | Saxe | 365/45 |
| 4,524,429 | 6/1985 | Giebel | 365/189 |

Primary Examiner—James W. Moffitt
Attorney, Agent, or Firm—Flehr, Hohbach, Test, Albritton & Herbert

[57] ABSTRACT

A high speed data storage array is defined utilizing a unique cell design for high speed sampling of a rapidly changing signal. Each cell of the array includes two input gates between the signal input and a storage capacitor. The gates are controlled by a high speed row clock and low speed column clock so that the instantaneous analog value of the signal is only sampled and stored by each cell on coincidence of the two clocks.

19 Claims, 4 Drawing Sheets

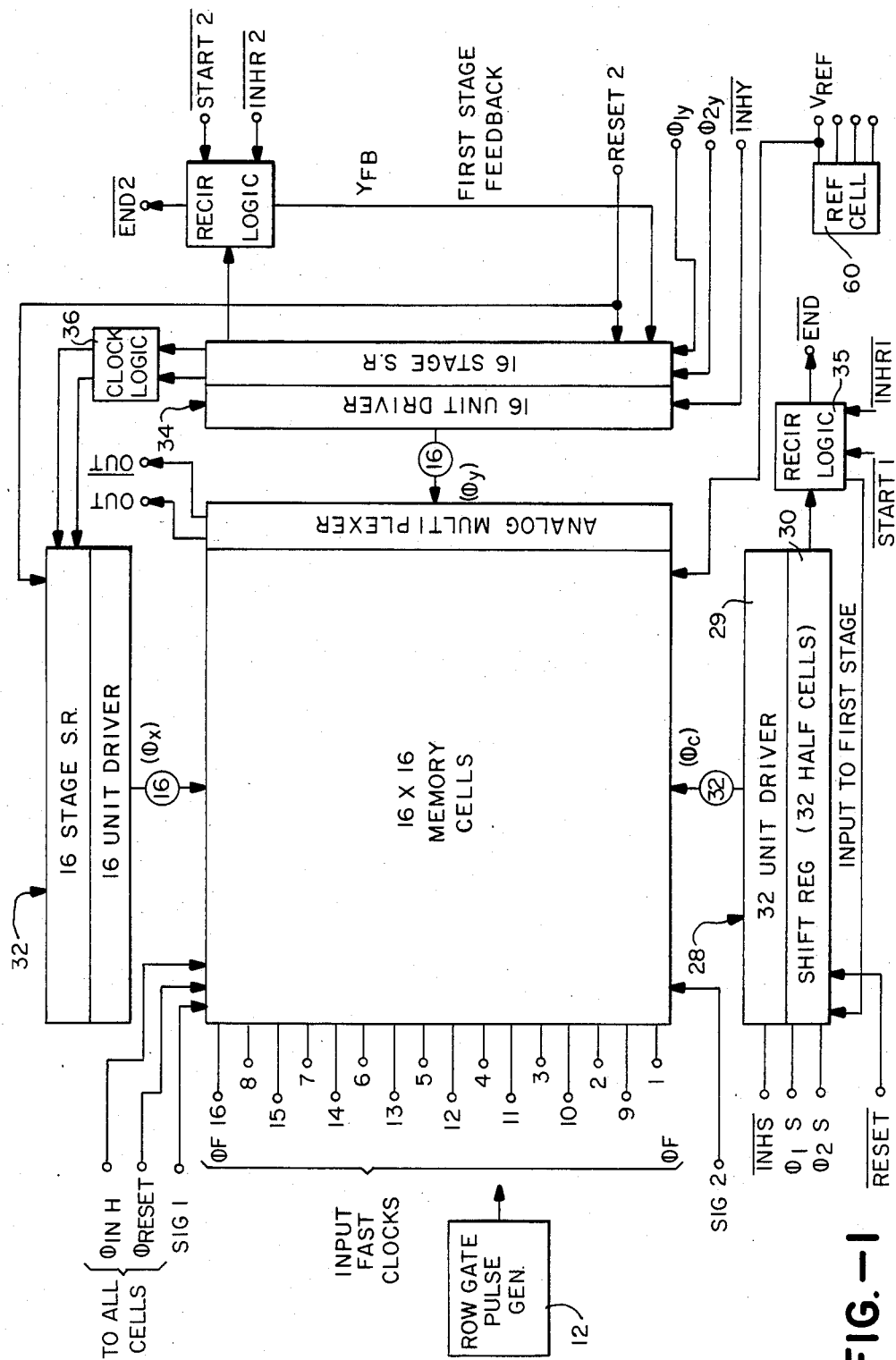
FIG.—1

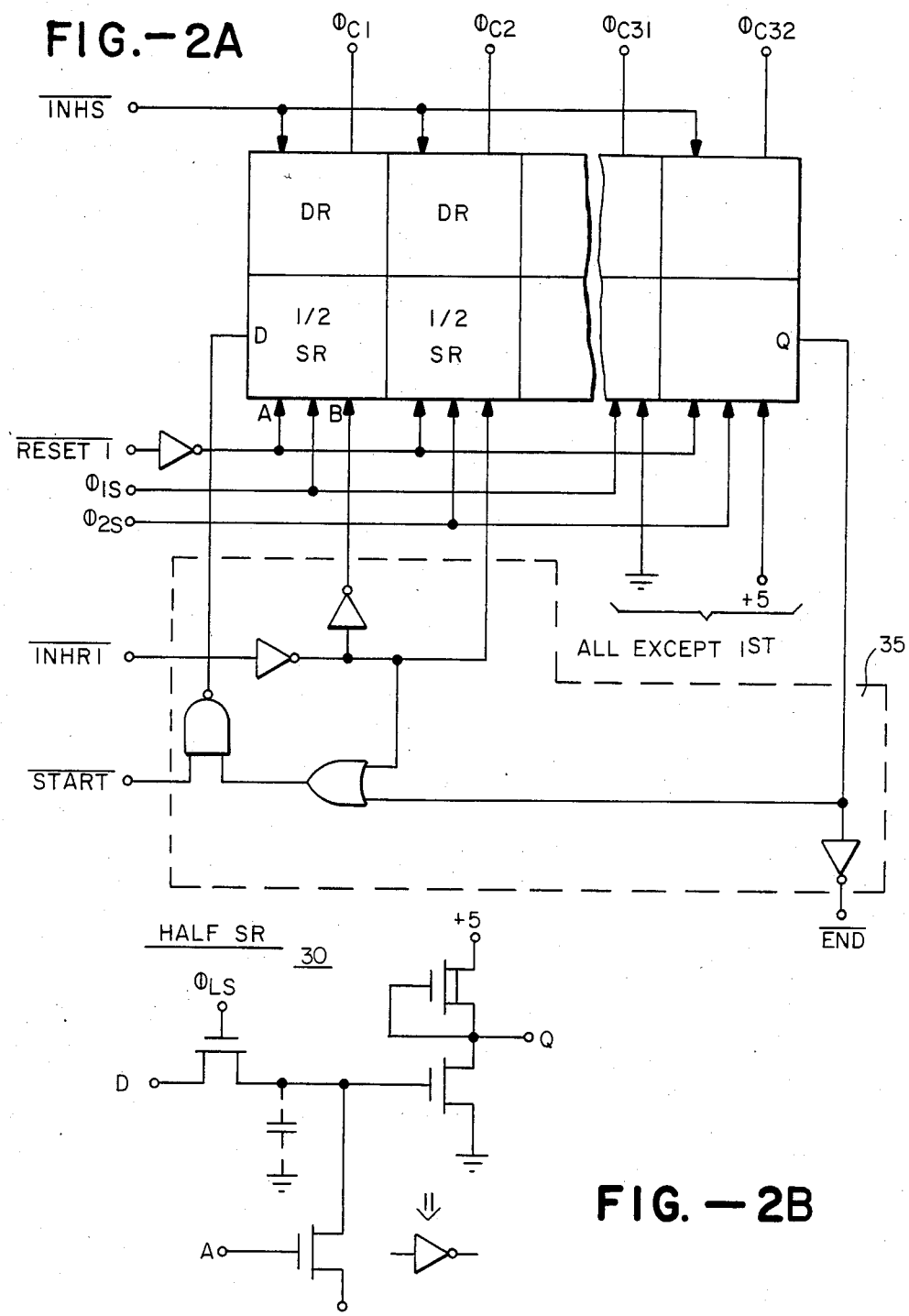

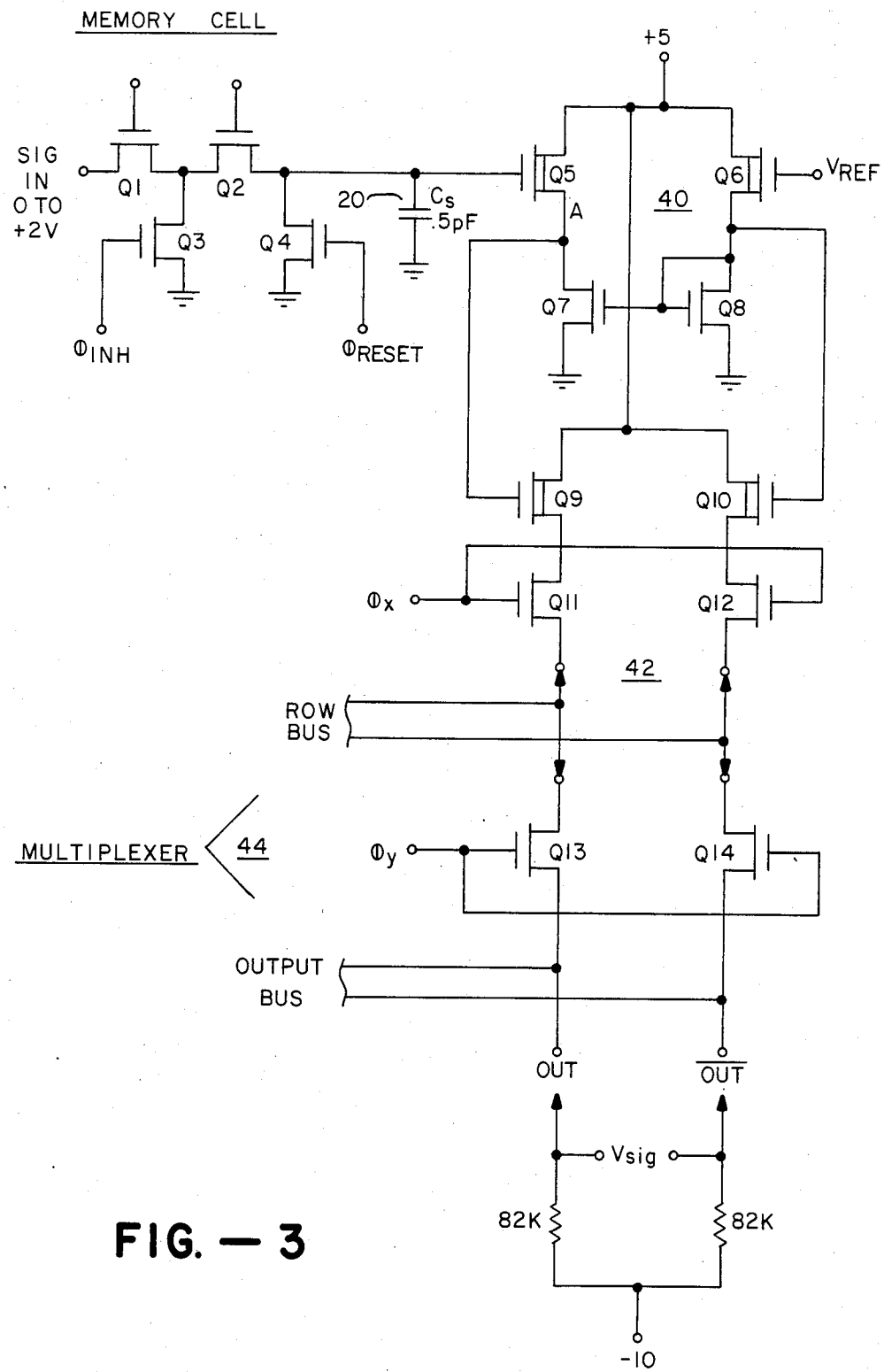
FIG. — 3

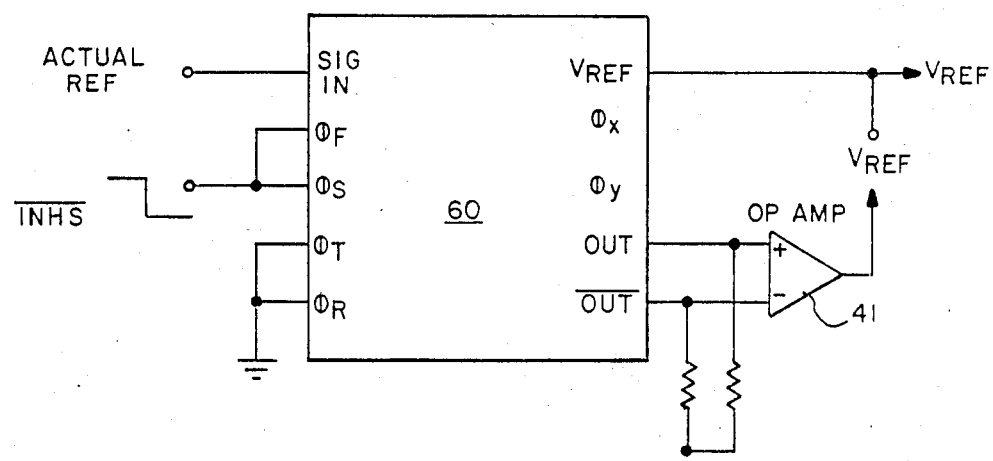
FIG.—4
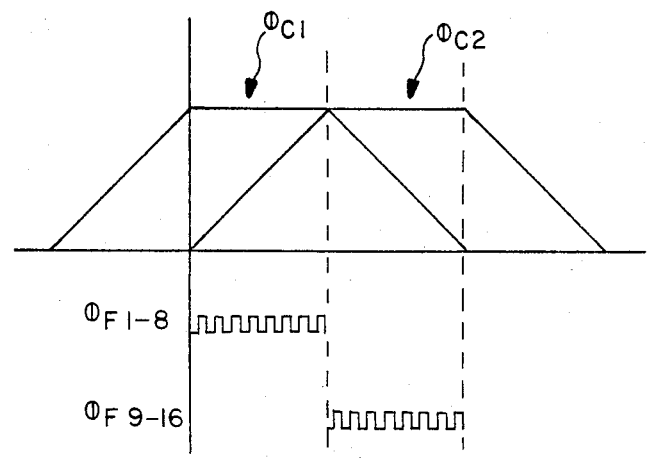
FIG.—5

ANALOG STORAGE INTEGRATED CIRCUIT

The Government has rights in this invention pursuant to Contract No. DE-AC03-76SF00515 awarded by the Department of Energy.

This is a continuation of application Ser. No. 595,790 filed 4/02/84 now abandoned.

The invention is directed generally to an analog storage device and more particularly to a device for very high speed sampling of analog pulse information, the pulse widths being in the range of 10's of nanoseconds.

An increasingly important problem in large scale physics detectors is the sampling of and recording of analog pulse information for pulse widths in the range of a few tens of nanoseconds with accuracy of the order of one percent and with a dynamic range of the order of eleven bits (one part in two-thousand). The generation of high precision time and amplitude information related to the outputs from various kinds of detectors is of considerable significance in applications including high energy physics, transient digitizing of signals associated with nuclear impulses, laser fusion, optic communication, and general lab measurement methods. In most known systems, the accuracy degrades significantly as the signal to be sampled approaches the low end of the dynamic range. It is therefore an object of the present invention to provide an analog pulse sampling system and method which can maintain a high level of accuracy over a wide dynamic range.

An objective of the present invention is to provide an improved analog pulse storage integrated circuit.

Analog pulse storage systems frequently find use in instrumenting and recording the data from large scale experiments which may have up to several hundred thousand channels of information consisting of time and amplitude measurement of the signal. An objective of the present invention is to provide an integrated detector which is of small size, low power, and low cost to be used to detect the signal values carried on each channel.

Because of the very low pulse width, in the range of a few 10's of nanoseconds, an effective sampling rate of $2 \times 10^8$ samples per second is desirable, while maintaining accuracy on the order of 11 bits.

Prior art attempts to monitor and record analog pulse information for very small width pulses has frequently utilized threshold detetors which could not provide detailed analysis of the pulses being studied.

An objective of the present invention is to provide analog pulse sampling information comprising a plurality of sample points for a pulse on any given channel, each sample having an aperture of about 1 nanosecond with a sample time position error less than or equal to 0.1 nanosecond.

The sample clock interval should be both very regular and at extremely high frequency to provide a maximum number of samples across the pulse, which may have a pulse width of no more than a few 10's of nanoseconds.

Another objective of the present invention is to provide an integrated circuit solution, in order to reduce the cost and maximize the speed of the sampling chip. It is therefore highly desirable to provide a chip having a sampling cell design which is highly regular and thus extremely reproducible on a large scale.

Known methods of high speed sampling for a multiple channel environment include cascaded discrete component sample and holds in each channel. However, the use of discrete components limits the number of channels which can be instrumented due to drive problems, and component size and speed limits the number of samples which can be made per channel.

A second known prior art device is the RETICON 5501 which is a bucket brigade device of a well known design. However, this device as with the device described above must be cascaded, so that it suffers from drive problems and size limitation. Also, because of the way the circuit is designed, the sampling rate cannot be controlled except by cable delay of the sampling gate which is very cumbersome. The sampling aperture time is relatively limited. The analog storage system described in IEEE Transactions on Nuclear Science, Vol NS30, February 1983 at page 339–341 suffers from the same limitations, due to the use of a delay line.

Another method in some general use is to place a high speed or flash ADC analog to digital converter on each channel. Such devices work at rates of $100 \times 10^6$ samples per second (100 mhz) but yield accuracies no better than 5 to 6 bits, unless extended by elaborate additional circuitry. The cost of a single converter and the power consumption for each converter are both undesirably high for large systems, and probably impractical for systems for greater than 100,000 channels.

The limitations of the prior art are overcome in the presently disclosed analog storage integrated circuit, in which each storage cell is defined to include two input gates between the pulse input at which the analog pulse information is received, and a storage capacitor for storing the analog signal level for the defined aperture. The cells are arrayed in rows and columns, and the input gates are controlled by separate row and column clocks. One of the clocks operates at a relatively low rate; the other clock operates at the rate of sampling. Data is read and stored by each cell only on coincidence of the two clocks. Therefore, if the low speed clock is the column clock, and the high speed clock is the row clock, then the column clock need shift from column to column only after every row cell in that column has been activated by the row clock.

Utilizing this arrangement, one clock may be continuously running, the other clock being initiated by detection of the pulse to be sampled, or by receipt of a known time marker or trigger synchronously with the arrival of the data pulse to be sampled.

Use of a chip design having such a regular array of cells lends itself to cascading to extend the number of samples per channel before any stored cell data is read out.

In a further advantage, if a sufficient number of cells are provided to separately store all the analog pulse sample information appearing on a channel, then the storage time can be extended to any length compatible with the ultimate data storage device.

In the data storage array of the present invention, a separate reference cell is provided of identical design to all of the storage cells on the chip, but not receiving any of the analog pulse information. By reading out the analog storage cell in parallel with the output of the storage transistor on each cell through matched transistors incorporated in each cell, any degradation of the analog information on the cell with storage time can be taken into account. Further, reading out the information through matched transistor pairs for the reference cell output and the storage capacitor cell output on a differential basis maintains the absolute accuracy of the magnitude of the analog data stored in each cell.

In a further advantageous feature of the present invention, the columns are divided vertically into two halves. Therefore, the column pulse which activates the controls for the cells in the bottom half of the column can overlap in real time with the pulse being used to activate the control gates for the other half of the column. By interleaving the numerical sequence of row activation, the speed of the actual pulse writing (storage) is optimized, while minimizing the complexity of the input clock timing circuitry.

The foregoing and other advantages of the present invention will become more apparent from a study of the following figures wherein:

FIG. 1 comprises a block diagram of the analog storage integrated circuit system of the present invention.

FIG. 2 is a more detailed block diagram of the on-chip input shift register of the present invention.

FIG. 2B is a diagram of a half shift register used in the shift register of FIG. 2A.

FIG. 3 is a schematic diagram of the structure of each of the cells incorporated in the 16×16 memory cell array shown in FIG. 1.

FIG. 4 is a more detailed schematic of the reference cell of the present invention.

FIG. 5 illustrates the relative timing of two column clock pulses to the split line of cells in each column, as well as the relative timing of the row and column timing pulses.

The basic elements of the analog storage integrated circuit are shown in FIG. 1. All These elements illustrated are on chip except the row gate pulse generator 12 which comprises the row clock trigger. A differential buffer (not shown) is also provided for reading out the stored data to a remote memory. The input signal which is an analog pulse typically of a few 10's of nanoseconds is applied simultaneously to all of the inputs of all of the cells via inputs SIG1 and SIG2. Typically there are two-hundred-fifty-six cells on each sampler chip arrayed in a 16×16 matrix as shown in FIG. 1. Each cell is designed in accordance with the schematic shown in FIG. 3. As shown therein, each of the cells includes a storage capacitor 20 which is capable of storing charge only during the time period that both of the input gate transistors Q1, Q2 are turned on. The other details of the cell of FIG. 3 are explained below.

Returning to FIG. 1, the row gate clock pulse generator 12 runs continuously at the analog pulse sampling rate. The arrival of the analog data pulse on input lines SIG1, SIG2 is signaled by either a threshold detector which detects the actual pulse, or a pulse detector which receives a trigger pulse which is transmitted in timed relation to receipt of the analog pulse. Turning on the column gate pulse generator 28 will now transmit column clock input signals to each of the memory cells in turn. This signal to each cell is shown as $\phi c$ at gate Q2 in FIG. 3. Coincidence of the row and column clock signals at any gate allows storage of a brief analog sample (aperture about 1 nanosecond) of the data pulse on the storage capacitor. Signal storage occurs when $\phi_f$ makes a high to low transition, turning OFF Q1. The stored value cannot be altered by $\phi_f$ being at a high state if $\phi_c$ is low so that Q2 is off. The gate transistors are separately activated by a row pulse generator 12 and a column gate pulse generator 28 which includes a unit driver 29 and shift register 30. Two points are significant with respect to arrangement of the memory cells. It can be seen that the 16 fast clock pulses are provided to rows which are interleaved; that is, the numbers on the 16 inputs represent the order in which the rows are triggered. This is to allow for the propagation time of the column clock signals up the columns, since the row clock signals are transferred horizontally on metal lines which carry signals at very fast speeds, but the clock signals run vertically up polysilicon liees which have longer propagation delays Because of the high speed at which the column gates are triggered, with only 80 nanoseconds allocated per column, each column is actually divided in two sections That is, in each vertical column of 16 cells, 8 of the cells are triggered by one output of the shift register 30 and driver 29. The other 8 cells, are triggered of a second output. Thus for example alternate groups of cells in the trigger sequence (1-8,9-16) are triggered by alternate column clock outputs ($\phi c1, \phi c2$). Thus the input shift register 30 which provides column clock signals to the columns has 32 outputs ($\phi c1, \ldots \phi c32$). Note that the column gate pulse generator 28 (shown in FIG. 2B) comprises a set of half-shift registers 30 and accompanying drivers, both of standard design as shown in detail in FIG. 2B. The input signals D and A and output signal Q appear in both FIG. 2B and FIG 2A to show the relationship between the two figures. The major control signals which are used to implement this timed storage operation are shown both in FIG. 2A and FIG. 1;

$\overline{\text{INHS}}$: runs to column access drivers; if low, turns off the column clocks so no cells can be turned on, preventing an attempt to store data into a cell which has not yet been read of previously stored data.

$\phi 1s, \phi 2s$: the two phase column clocks for driving the two sets of half shift registers; this is necessary because of the overlapping output of the column clock pulses shown in FIG. 5.

$\overline{\text{RESET}}$: initializes all registers to starting state.

$\overline{\text{START}}$: puts bit in first register to be advanced through registers by $\phi 1s, \phi 2s$.

$\overline{\text{INHRI}}$: if low, clears all column clocks to 0; if high, then recirculation occurs, so that the first two half shift registers are high, (see FIG. 2A) and the rest are zero.

$\overline{\text{END}}$: if cells are cascaded, then this signal output occurs at the proper time to start data storage in the next chip.

The Recirculation logic, 35, shown in detail in FIG. 2A, responds to and generates these last three signals. Generation of the other identified signals is accomplished by techniques well known in this art.

The x and y coordinate output shift registers 32, 34 are of similar design to those shown in FIG. 2A. The clock logic is used to simplify chip layout, as these shift registers run at the same rate-typically significantly slower than the input rate.

Returning to the design of the memory cell itself, as shown in FIG. 3 each cell includes in addition to the input section a highly linear output stage. Specifically, each memory cell includes a nonloading readout amplifier section 40, and multiplex readout portion 42 for conveying a linear representation of the charge stored on the capacitor 20 through the multiplex readout portions 42 and 44 to the chip outputs OUT and $\overline{\text{OUT}}$.

Each of the output sections including the non-loading amplifier 40 and the buffer amplifier 42 comprise matched pairs of identical transistors. The input to the transistor Q5 of amplifier 40 is connected to the capacitor $C_s$. Thus upon coincidence of the readout signals $\phi_x, \phi_y$ from the output shift drivers 32, 34 the voltage at point A linearly tracks the voltage stored on $C_s$.

By providing a transistor Q7 to function as a current mirror, and a transistor Q9 which has the voltage at point A applied to its gate and functions as a source follower, a linear representation of the magnitude of the voltage stored on the capacitor 20 can be applied to the output bus through the multiplexor 44.

In order to provide for temperature compensation and leakage from the capacitor, a reference cell 60 shown in detail in FIG. 4 is provided on each chip. As can be seen from FIG. 4, the design of the reference cell 60 is identical to the design of each of the memory cells in the array. The cell is pulsed by INHS after all data cells have received the data which they are to store; thus the voltage V ref which is applied to the transistor Q6 provides a differential reference level which is coupled through transistors Q8, Q10, Q12, and Q14 to the output bus so that a reference level is always available which accounts for the temperature changes and capacitor leakage. Thus the output being read as, a differential output will accurately represent the analog pulse sample. The use of differential signal readout for Vsig, together with careful use of matched transistor pairs 40 and 42 from $C_s$ and V ref through the multiplexer 44 to the output prevents signal level errors due to process and temperature variations.

Two further transistors Q3 and Q4 are provided in the cell input stage to further enhance the accuracy of the stored analog value. A signal $\phi$reset is provided to gate a transistor Q4 connected across the storage capacitor 20 incorporated in each memory cell. This is provided to allow for draining the storage capacitor 20 to ground after the data has been read out to remote storage. A second signal $\phi$INH is provided to gate a transistor Q3 connected to a node in between the two gate transistors Q1, Q2. This is used to ground the intermediate node, so that any leakage current, gate or signal feed-through from the first gate, which is the gate receiving the continuously running fast row clock pulses, does not affect the readout of the storage capacitor 20.

It will be apparent to one of skill in the art who has reviewed the subject invention disclosed, that the integrated circuit design of the present invention provides a number of significant advantage in the field of physics data recording. The use of NMOS IC technology, for the analog storage cell, allows an order of magnitude improvement in density and makes practical systems of a very large scale because of the ease of reproduction of the integrated circuit and the low power consumption. The accuracy of the analog samples recorded will be significantly improved because of the identity of every cell in the memory cell array. The power consumption will be significantly reduced over known prior art methods such as Flash A/D converters. Any high power circuitry required for drive purposes can be shared by many channels. The dynamic range, the sampling aperture, and the accuracy are much improved over known methods. An accuracy of 11 bits (one in two-thousand) compared with six bits (one in sixty-four), is achieved. The cost per channel in large scale systems will be significantly reduced. The figure of merit (speed×dynamic range divided by cost) will yield an improvement ratio of at least 100 to 1 compared with current alternatives. Persons skilled in this field on reviewing this invention disclosure may make modifications to the present design. Therefore, the scope of the present invention is to be limited only by the following claims.

What is claimed is:

1. A high speed data acquisition system for storing a succession of analog signal sample values comprising analog signal input means and analog signal output means, a first analog input bus connected to said analog signal input means and a second analog output bus connected to said analog signal output means, a storage array comprising a plurality of cells arranged in rows and columns, row clock means coupled to said storage array for selectively activating each row of said storage array, column clock means coupled to said storage array for selectively activating each column of said storage array, said analog signal input means being directly connected to said storage array for supplying an analog signal to the cells of the array, and means responsive to the row and column clock means for successively activating each of said cells for storing a succession of analog signal sample values comprising samples of said analog signal, each of said cells comprising a pair of gates connected between said analog signal input means and a first capacitor in said cell for causing said first capacitor to store each said analog signal sample value, said gates being responsive to said row and column clock activating means, each of said cells comprising a voltage follower coupled to said first capacitor, and a multiplex output device connected between said voltage follower and said second analog output bus for transferring a proportional represnntation of each said stored analog signal sample value to said output bus.

2. A system as claimed in claim 1 wherein said row and column clock means comprise clock driven devices operating at first and second rates of repetition.

3. A system as in claim 2 wherein said row and column clock means comprise first and second clock drivers having clock pulse outputs runnings to said rows and said columns respectively to provide output clock pulses thereto, the first of said clock drivers running continuously, the second of said clock drivers being periodically activated upon receipt of said analog input signal.

4. A system as claimed in claim 2 further comprising a reference cell comprising two output gates and a reference storage capacitor and having an output connected in parallel with the output of each cell of the array, a decaying voltage on the reference storage capacitor representing nominal decay of cell storage voltage with time occurring in each said cell of the array.

5. A system as claimed in claim 3 wherein each of said columns in the array is divided into first and second portions, said column clock means having separate first and second outputs running to said first and second portions of said column, output clock pulses from said first and second outputs being overlapping in time to continuously sample said analog signal.

6. A system as claimed in claim 5 wherein said row clock driver comprises a continuously running clock successive row output clock pulses being connected to alternate rows of said array.

7. A system as claimed in claim 6 comprising n consecutively numbered rows wherein rows numbered from 1 through n/2 are interleaved with rows numbered from (n/2)+1 to n, to form said first and second portions, the rows being activated in numerical order.

8. A system as in claim 1 wherein said first capacitor cooperates with the internal resistance of said gates to form an RC circuit having a short time constant defining a time aperture of said analog signal sample value of said analog signal.

9. A system as claimed in claim 8 wherein each of said gates comprises an N-channel transistor having a control gate connected to and responsive to the row and column clock means.

10. A system as claimed in claim 8 wherein the time constant of said RC circuit is less than 1 nanosecond.

11. A system as claimed in claim 8 further including a switch coupled gates to said first capacitor and responsive to a reset signal for grounding the capacitor, whereby rapid resetting of said cells after storage of samples of said analog signal is achieved.

12. A system as claimed in claim 8 further comprising means for grounding at least one electrode of one of said gates during a reading cycle whereby the signal leakage of said input gates does not affect the analog signal sample value in the cell of said system.

13. A system as claimed in claim 1 further comprising means for reading out the analog signal sample values stored in the array comprising a first shift register means for generating row activating readout signals coupled to the rows of said array and a second shift register means for generating column readout signals coupled to the columns of said array, said column readout shift register advancing by one column each time every row has been pulsed by said row shift register.

14. A system as claimed in claim 13 further comprising means coupling said row and column shift register means for causing completion of a cycle by said row shift register means to advance said column shift register.

15. A method of very high frequency analog pulse sampling of an analog signal supplied to an array of cells arranged in n rows and m columns, comprising selectively activating each said row of said array while each of said columns is activated selectively, to cause each said cell to store a sample of said analog signal, supplying an analog input signal to the cells of the array, said rows being activated for a time interval defining a minimum pulse sampling interval of said analog input signal, said row activating step comprising activating alternate ones of n rows in a pulse sampling cycle wherein all of said rows are activated, n being the number of rows in the array, the rows 1 through n/2 being interleaved with the rows (n/2)+1 to n during said cycle and being activated in numerical order to reduce the sampling spacing time limit caused by propagation delay in column clock signals activating said cells in said columns.

16. A method as claimed in claim 15 wherein said rows are being continuously cyclically activated, said columns being activated only during receipt of said pulse to be sampled.

17. A method as claimed in claim 16 wherein said rows are activated at a multiple of the rate at which columns are activated.

18. A method as claimed in cliam 17 further comprising the step of providing a reference cell identical in construction to the cells in said array but not receiving said supplied analog signal, the method including the step of reading the output of each cell as a differential output compared to an output of the refernce cell whereby leakage and offset are taken into account.

19. A method as in claim 17 wherein each said column is divided into two sections having an equal number of cells, the method including the step of providing actuating pulses to successive numerically ordered ones of the cells thereby alternating between cells in said two sections and overlapping in real time to maximize the speed of writing to each cell.

* * * * *

UNITED STATES PATENT AND TRADEMARK OFFICE
CERTIFICATE OF CORRECTION

PATENT NO. : 4,811,285

DATED : March 7, 1989

INVENTOR(S) : J.T. Walker, R.S. Larsen, S.L. Shapiro, and S.I. Chae

It is certified that error appears in the above-identified patent and that said Letters Patent is hereby corrected as shown below:

Coverpage, [75] Inventors:, after "Palo Alto",
        insert --Soo-Ik Chae, Stanford,--.

Signed and Sealed this

Twenty-fifth Day of December, 1990

Attest:

HARRY F. MANBECK, JR.

*Attesting Officer*      *Commissioner of Patents and Trademarks*